United States Patent [19]
Tobita

[11] Patent Number: 4,802,123
[45] Date of Patent: Jan. 31, 1989

[54] SEMICONDUCTOR INTEGRATED CIRCUIT DEVICE

[75] Inventor: Youichi Tobita, Hyogo, Japan

[73] Assignee: Mitsubishi Denki Kabushiki Kaisha, Tokyo, Japan

[21] Appl. No.: 5,855

[22] Filed: Jan. 21, 1987

[30] Foreign Application Priority Data

Jan. 22, 1986 [JP] Japan .................. 61-13087

[51] Int. Cl.$^4$ .................. G11C 11/24; G11C 7/00
[52] U.S. Cl. .................. 365/149; 365/189
[58] Field of Search .................. 365/149, 189

[56] References Cited

U.S. PATENT DOCUMENTS

| | | | |
|---|---|---|---|
| 3,976,948 | 8/1976 | Hirasawa | 365/149 |
| 4,156,939 | 5/1979 | Takemae et al. | 365/182 |

FOREIGN PATENT DOCUMENTS 72691 6/1979 Japan .

OTHER PUBLICATIONS

Moschwitzer and Lunze, *Halbleiterelektronik*, (1980): 367–369; 490–492.

*Primary Examiner*—James W. Moffitt
*Attorney, Agent, or Firm*—Lowe, Price, LeBlanc, Becker & Shur

[57] ABSTRACT

An IC device in accordance with the present invention comprises: a capacitor (1); a plurality of FETs, one (5) of which has a back-gate electrode (9) and constitutes a memory cell with the capacitor; and a voltage source circuit (100) which supplies the back-gate electrode (9) with a prescribed voltage whereby the absolute value of threshold voltage of the FET (5) in the memory cell is made lower than that of the remaining FET(s).

4 Claims, 2 Drawing Sheets

SEMICONDUCTOR INTEGRATED CIRCUIT DEVICE

BACKGROUND OF THE INVENTION

1. Field of the Invention

This invention relates to a seimconductor device of an integrated circuit (IC) and more particularly to an IC device which includes a plurality of field effect transistors (FETs), at least one of which has a back-gate electrode.

2. Description of the Prior Art

Referring to FIG. 1, there is shown a circuit diagram including a conventional dynamic memory cell and a decoder for selecting a memory cell. This dynamic memory cell comprises a capacitor 1 for storing charge corresponding to a binary memory information of "1" or "0" and an N channel FET 5 for bidirectionally controlling read and write of data. An electrode 2 of the capacitor 1 is connected through a node 10 to a source (or drain) electrode 7 of the FET 5, while the other electrode 3 is connected to a terminal 4 which is supplied with a given voltage. A drain (or source) electrode 6 of the FET 5 is connected through a node 14 to a bit line 11 for transmitting data. A gate electrode 8 of the FET 5 is connected through a node 13 to a word line 12 which is supplied with a signal for selecting a memory cell. A back-gate electrode 9 of the FET 5 is connected to a terminal 15 which is supplied with a given voltage.

A decoder 16 has input terminals 17 and an output terminal 18. The input terminals 17 receive address signals ($A_1, \overline{A}_1, \ldots, A_n, \overline{A}_n$) for selecting a word line 12. An N channel FET 19 transmits a clock signal $\phi$ on a signal input terminal 24a to the word line 12, depending on the potential level at the output terminal 18. The FET 19 has a drain (or source) electrode 20 connected to the signal input terminal 24a, a source (or drain) electrode 21 connected to the word line 12, a gate electrode 22 connected to the output terminal 18 and a back-gate electrode 23 connected to a voltage terminal 15.

In operation of reading data from the memory cell, when the decoder 16 is selected by the address signals ($A_1, \overline{A}_1, \ldots A_n, \overline{A}_n$), the level of the output terminal 18 become "H" ("1") and then the FET 19 is turned on. When the clock signal $\phi$ changes from "L" level to "H" level, the level of the word line 12 changes from "L" to "H" with the FET 19 being turned on. At this time, since the FET 5 is turned on, the electrode 2 is connected with the bit line 11 and then data is read out from the memory cell. In order to make this read operation faster, it is desired that both the FETs 5 and 19 can be readily turned on. To achieve this, the threshold voltages $V_{TH5}$ and $V_{TH19}$ of the respective FETs 5 and 9 may be set as low as possible.

On the other hand, the memory cell has to hold data even when the level of the bit line 11 is "L". When the level of the word line 12 becomes "L", the FET 5 is turned off. If "L" level is read from another cell (not shown) through the same bit line 11, the level of the bit line 11 becomes "L", i.e., "0". In the case that the threshold voltage $V_{TH5}$ of the FET 5 is set lower to make read operation faster, a small leak current will flow from the source electrode 7 of the FET 5 to the drain electrode 6, even though the voltage of the gate electrode 8 is lower than the threshold voltage $V_{TH5}$. As a result, when the potential of the bit line 11 is 0 and "H" level is stored in the capacitor 1, the stored charge flows little by little from the electrode 2 to bit line 11 through the FET 5 and finally the capacitor 1 becomes "L" level. Namely, data in the memory cell disappears. This means erroneous operation of the memory circuit.

In order to prevent such erroneous operation, the threshold voltage $V_{TH5}$ of the FET 5 is generally set to be higher than the threshold voltage $V_{TH19}$ of the FET 19. To this end, the channel region of the N channel FET 5 is selectively doped with P type dopant by ion implantation or the like. This additional step in the manufacturing process involves increase of the cost.

Incidentally, some IC devices which include FETs having back-gate electrodes are described in the Japanese Patent Laying-Open Gazette No. 72691/1979.

SUMMARY OF THE INVENTION

In view of the above described prior art, it is a major object of the present invention to provide an IC device including FETs, the threshold voltages of which can be controlled without increase of the cost.

An IC device in accordance with the present invention comprises: a capacitor; a plurality of FETs, one of which has a back-gate electrode and constitutes a memory cell with the capacitor; and a voltage source circuit which supplies the back-gate electrode with a prescribed voltage whereby the absolute value of threshold voltage of the FET in the memory cell is made higher than that of the remaining FET(s).

These objects and other objects, features, aspects and advantages of the present invention will become more apparent from the following detailed description of the present invention when taken in conjunction with the accompanying drawings.

BRIEF DESCRIPTION OF THE DRAWINGS

In these figures, the same reference numbers are used for the same or corresponding portions.

DESCRIPTION OF THE PREFERRED EMBODIMENTS

Figure 1:
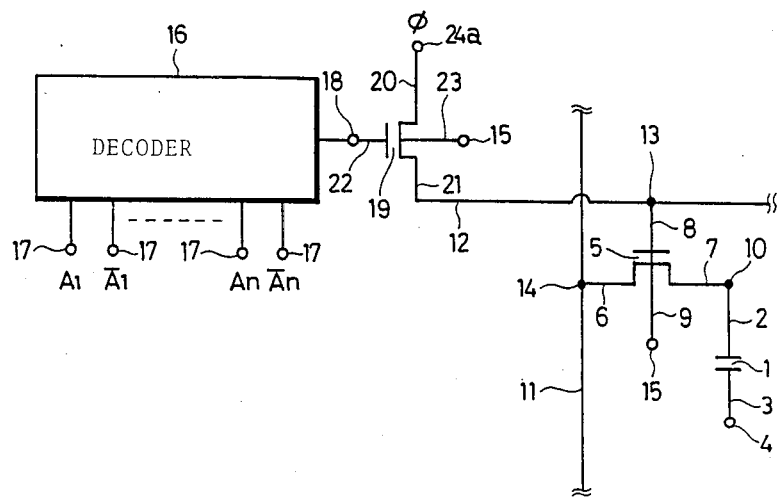
FIG. 1 is a circuit diagram of an IC device according to the prior art.
Figure 2:
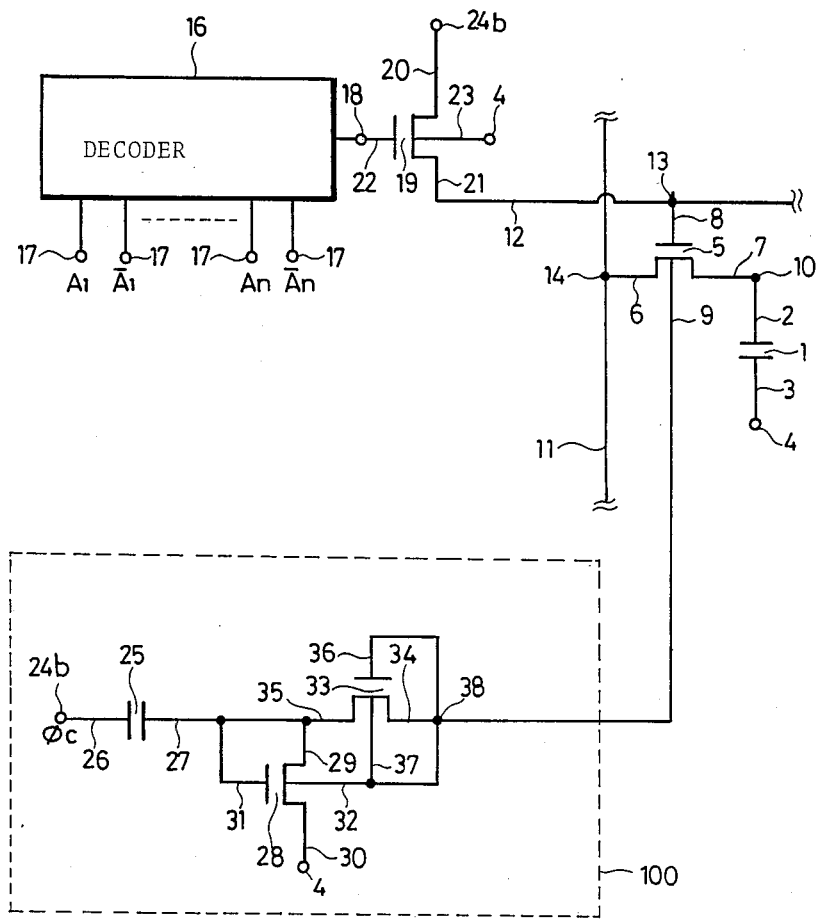
FIG. 2 is a circuit diagram of an IC device according to the present invention.

Referring to FIG. 2, there is shown a circuit diagram of an IC device according to an embodiment of the present invention. This figure is similar to FIG. 1 but includes a back-gate voltage supplier circuit 100. An electrode 26 of a coupling capacitor 25 is connected to a signal input terminal 24b, while the other electrode 27 of the capacitor 25 is connected to a drain electrode 29 and a gate electrode 31 of a discharge FET 28 of an N channel type. A source electrode 30 of the FET 28 is connected to a voltage terminal 4. A drain electrode 34, a gate electrode 36 and a back-gate electrode 37 of a rectification FET 33 of an N channel type are tied together at a node 38 and connected to the back-gate electrode 9 of the FET 5, while a source electrode 35 of the FET 33 is connected to the drain electrode 29 of the FET 28. A back-gate electrode 32 of the FET 28 is also connected to the node 38.

This circuit 100 is generally known as the one that receives an alternating signal $\phi_c$ at the signal input terminal 24b and generates a negative DC voltage. The DC voltage appears at the node 38 and is used as the back-gate voltage $V_{BG}$. The back-gate voltage $V_{BG}$ is determined by the amplitude $V_{CC}$ of the alternating signal $\phi_c$ and the threshold voltage $V_{TH}$ of the discharge FET 28 and rectification FET 33 according to the following equation (1).

$$V_{BG} = -(V_{CC} - 2V_{TH}) \tag{1}$$

Suppose $V_{CC} = 5V$ and $V_{TH} = 0.5V$, we will obtain a value of $V_{BG}$ as follows.

$$V_{BG} = -4V \tag{2}$$

In the meantime, the threshold voltage $V_{TH}$ of the FETs, to which a back-gate voltage $V_{BG}$ is applied, is determined by the following equation (3):

$$V_{TH} = K_1 \sqrt{|\phi_S + V_{BG}|} + V_{SS} \tag{3}$$

where $K_1$ and $V_{SS}$ are constants and $\phi_S$ equals $2\phi_F$ ($\phi_F$: Fermi potential), i.e., $-0.6V$. When the dopant concentration in the channel region of FETs 5 and 19 is $1 \times 10^{15} \text{cm}^{-3}$ and the thickness of the gate oxide layer is 300 Å, the constant $K_1$ becomes about 0.15. Therefore, we will obtain a value of $V_{TH5}$ as follows.

$$\begin{aligned} V_{TH5} &= 0.15 \times \sqrt{|-0.6 - 4|} + V_{SS} \\ &= 0.32 + V_{SS} \end{aligned} \tag{4}$$

On the other hand, the back-gate electrode 23 of the FET 19 is connected to the voltage terminal 4 and thus $V_{BG} = 0$. Therefore, we will obtain a value of $V_{TH19}$ as follows.

$$\begin{aligned} V_{TH19} &= 0.15 \times \sqrt{|-0.6|} + V_{SS} \\ &= 0.11 + V_{SS} \end{aligned} \tag{5}$$

Consequently, the difference of the threshold voltages between FETs 5 and 19 can be obtained as follows.

$$V_{TH5} - V_{TH19} = 0.32 - 0.11 = 0.2V \tag{6}$$

Namely, a condition of $V_{TH5} > V_{TH19}$ is realized.

Figure 3:
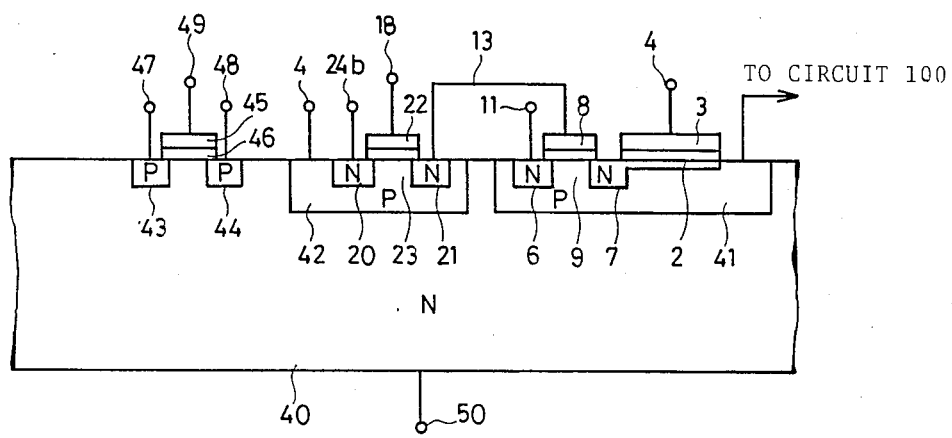
FIG. 3 is a sectional view of an IC device according to the present invention.

Referring to FIG. 3, there is shown a fragmentary sectional view of an IC device according to an embodiment of the present invention. It is noted that the same reference numbers are used in this figure as in FIG. 2 for corresponding portions. P type wells 41 and 42 of a relatively high resistivity are selectively formed on a main surface of an N type semiconductor substrate 40 of a high resistivity. P wells 43 and 44 of a low resistivity are formed on the same main surface of the substrate 40 to provide a source electrode and a drain electrode of a P channel FET, respectively. The P channel FET is provided with a gate oxide layer 46 and a gate electrode 45 of polysilicon or the like. Terminals 47, 48 and 49 are connected to the source electrode 43, the drain electrode 44 and the gate electrode 45, respectively. A terminal 50 is led out from the N substrate 40. The P channel FET in FIG. 3 does not directly relate to the present invention but is shown as an example of a complementary FET in an IC device.

Although the N channel FETs 5 and 19 are described in FIG. 2, P channel FETs can be adopted instead. In this case, the polarity of the back-gate voltage and the conductivity type of the semiconductor shown in FIG. 3 both should be inverted.

Further, although the alternating signal $\phi_C$ is supplied from the outside of the semiconductor chip, it may be generated internally.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An IC memory device comprising:
   an address decoder for selecting a memory cell of said memory device;
   a bit line for reading information out from a selected memory cell, said selected memory cell including a storage capacitor
   and a plurality of FETs, one FET of said plurality of FETs connecting said storage capacitor to said bit line, said FET having a back-gate electrode for controlling a threshold voltage of said FET, a gate electrode connected to an output of said address decoder, a first switched electrode connected to said bit line and a second switched electrode connected to said storage capacitor and
   a voltage source circuit which supplies said backgate electrode of said FET with a prescribed voltage for raising the threshold voltage of said FET of said memory cell above threshold voltages of the remaining FET(s) of said plurality of FETs to reduce a charge leakage from said storage capacitor.

2. An IC device in accordance with claim 1, wherein said remaining FET(s) also has a back-gate electrode(s).

3. An IC memory device comprising:
   a voltage source circuit;
   a memory cell for storing information;
   a bit line for reading information out from said memory cell;
   an address decoder for selecting said memory cell in response to an address signal; and
   a word line for connecting an output of said memory cell to said bit line, said memory cell including
   a storage capacitor,
   a first FET for gating an output of said address decoder onto said word line, said first FET having a first threshold voltage and including a gate electrode connected to an output of said address decoder, a first switched electrode connected to a source of a control signal, and a second switched electrode connected to said word line, and
   a second FET connecting said storage capacitor to said bit line, said second FET having a back-gate electrode for controlling a threshold of said second FET, a gate electrode connected to an output of said address decoder, a first switched electrode connected to said bit line and a second switched electrode connected to said storage capacitor, wherein said voltage source circuit supplies said back-gate electrode of said second FET with a prescribed voltage for raising said second threshold voltage of said second FET of said memory cell above that of said threshold voltages of said first FET to reduce a charge leakage from said storage capacitor.

4. An IC memory device in accordance with Claim 3 wherein said voltage source comprises:
- a control signal input terminal for receiving a control signal;
- a voltage supply input terminal for receiving a source of input voltage;
- an output node for supplying said prescribed voltage to said back-gate electrode of said second FET;
- a discharge FET having a gate electrode and a first switched electrode both connected to said control signal input terminal for receiving a control signal, a second switched electrode connected to said voltage supply input terminal, and a back-gate electrode for controlling a threshold of said discharge FET connected to said output node;
- a rectification FET having gate, first switched, and back-gate electrodes connected to said output node, and a second switched electrode connected to said control signal input terminal.

* * * * *